United States Patent [19]

Stultz et al.

[11] Patent Number: 5,089,957
[45] Date of Patent: Feb. 18, 1992

[54] RAM BASED EVENTS COUNTER APPARATUS AND METHOD

[75] Inventors: Perry S. Stultz, Gorham, Me.; James R. Hamstra, Shorewood, Minn.

[73] Assignee: National Semiconductor Corporation, Santa Clara, Calif.

[21] Appl. No.: 436,212

[22] Filed: Nov. 14, 1989

[51] Int. Cl.⁵ .................... G06F 9/34; G06F 11/34
[52] U.S. Cl. .................. 395/425; 364/230.1; 364/236.4; 364/239; 364/251.1; 364/251.3; 364/254.2; 364/255.4; 364/255.7; 364/259.9; 364/265.2; 364/265.3; 377/49; 395/725
[58] Field of Search ............. 364/200, 900; 377/49

[56] References Cited

U.S. PATENT DOCUMENTS

| | | |
|---|---|---|
| 3,353,160 | 11/1967 | Lindquist . |
| 3,597,641 | 8/1971 | Ayres .................... 307/303 |
| 3,599,162 | 8/1971 | Byrns .................... 364/200 |
| 3,643,218 | 2/1972 | Cramwinckel ............ 364/200 |
| 3,701,109 | 11/1970 | Peters .................... 340/172.5 |
| 3,815,105 | 6/1974 | Adkins et al. ........... 364/200 |
| 3,832,692 | 8/1974 | Henzel et al. ........... 364/200 |
| 3,967,095 | 6/1976 | Herring et al. ......... 235/92 |
| 4,115,855 | 9/1978 | Chiba .................... 364/200 |
| 4,206,346 | 6/1980 | Hirosawa et al. ....... 235/92 |
| 4,341,950 | 7/1982 | Kyles et al. ............. 235/92 |
| 4,625,292 | 11/1986 | Philip .................... 377/49 |
| 4,989,757 | 8/1987 | Downing et al. ........ 377/13 |

FOREIGN PATENT DOCUMENTS

63-47803 2/1988 Japan .
3244932 10/1988 Japan .

OTHER PUBLICATIONS

Floyd E. Ross, "FDDI-an Overview", Digest of Papers, Computer Soc. Intl. Conf. Compcon '87, pp. 434–444.
FDDI Physical Layer Protocol (Phy), Draft Proposed American National Standard, X3T9/85-39, Rev. 13, Aug. 22, 1986.
The Supernet Family for FDDI, Databook, Advanced Micro Devices pp. 3-1 through 3-57.
Supernet for Fiber Distributed Data Interface, Articles, Advanced Micro Devices.

Primary Examiner—Michael R. Fleming
Assistant Examiner—Ayaz R. Sheikh
Attorney, Agent, or Firm—Limbach & Limbach

[57] ABSTRACT

A system, for counting the occurrence of a plurality of system events and for prioritizing the order in which count values are to be incremented, receives a plurality of data signals (15) where each signal is associated with a system event. The data signals (15) are stored in a storage register (16). A memory device (12) stores a plurality of count values, where one count value is associated with each system event to be counted. Each count value is stored in a preselected memory location. The storage register (16) also receives a feedback signal (32) to update the signals (15) stored in the register (16). The storage register (16) generates a plurality of signals (19) which are input to a priority decoder (14) and the priority decoder (14) generates a priority signal (32) to address the location in the memory device (12) where the count value to be accessed is stored. The addressed count value (62) is input to an incrementor (22) where it is incremented and the incremented count value is stored in the memory device (12). The system may also include a multiplexer (90) to select the address signal (92) used to address the memory device (12), and temporary storage devices (80, 100) for respectively storing the selected address signal (92) or the count value accessed (62).

10 Claims, 8 Drawing Sheets

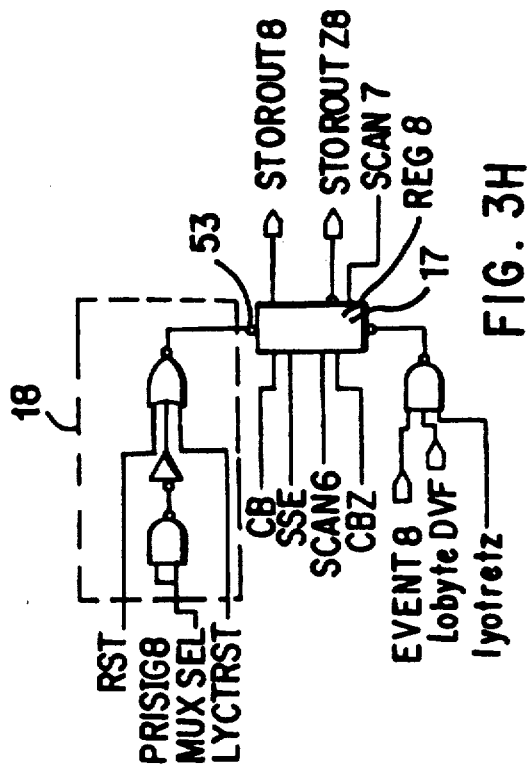
FIG. 3F
FIG. 3H
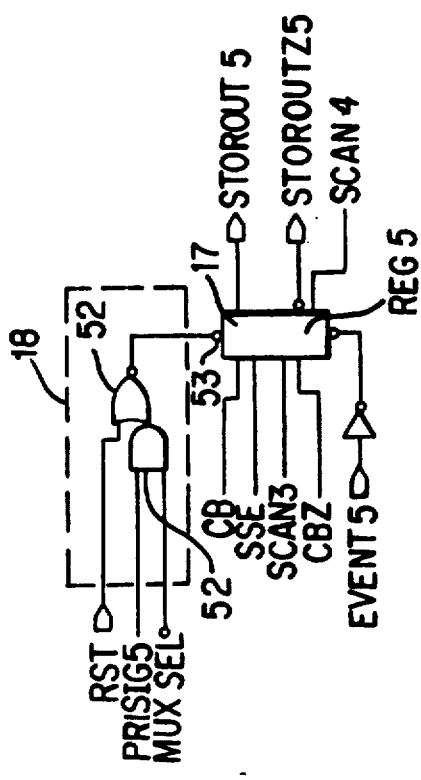
FIG. 3E
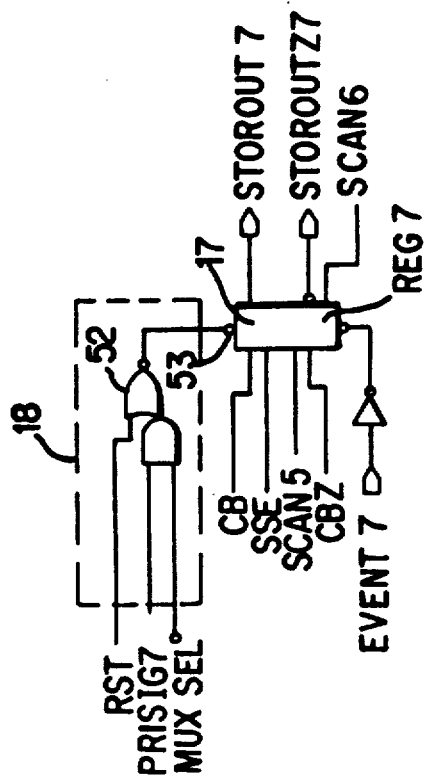
FIG. 3G

RAM BASED EVENTS COUNTER APPARATUS AND METHOD

TECHNICAL FIELD

The present invention broadly relates to an events counter and more particularly to a memory-based events counter where locations in a memory are allocated to store a particular count value.

BACKGROUND ART

In a data transmission system events may be monitored for diagnostic purposes or in order to optimize a system's efficiency. In the past, to count a plurality of system events, an individual storage register or counter was allocated for each type of event to be counted. The count value for each monitored event is stored in an individual register and during one clock cycle, the stored count value to be incremented is read out of each memory and incremented. Although all of the count values may be incremented simultaneously during one clock cycle, multiple counter registers are necessary, thereby occupying valuable space on an integrated circuit chip.

Storage registers, memories, prioritizer units, incrementors and counting systems are all well known. However, none of the conventional systems disclose a single memory based event counter system which prioritizes a plurality of input signals and generates a signal that is used to access the single memory device where the system counters are stored. While the prior art may reveal individual elements which may perform specific functions, it does not teach or suggest combining the elements to achieve a memory based event counter in accordance with the present invention.

For example, U.S. Pat. No. 3,701,109, titled, "Priority Access System," and issued on Nov. 9, 1970 to Theodore Peters, discloses an apparatus which prioritizes a plurality of users into one of N groups. The priority assigned to each group is based upon the extent and nature of usage by the users within each group. Within a group the priority assigned to each user for accessing a computer, for example, is the same and the users in a group sequentially access the computer The system has a random access memory (RAM) for storing the number of times a given group is accessed during a particular time period and an incrementor which increments this number and stores it back in the RAM. However, the Peters priority scheme cannot prioritize the order in which a plurality of counters stored in the RAM are to be updated when multiple simultaneous events occur, nor can it generate a priority signal to access the particular RAM memory location where the incremented count value is stored.

U.S. Pat. No. 4,341,950 titled, "Method and Circuitry for Synchronizing the Read and Update Functions of a Timer/Counter Circuit," and issued Jan. 24, 1980 to Ronald Kyles, discloses a synchronizing circuit which synchronizes the read and update functions of a counter circuit so that the read and update functions do not occur simultaneously. The Kyles circuit includes an N-bit counter and an N-bit storage register for storing the current count value of the counter. However, the system does not disclose means for incrementing a plurality of counters located in one storage device, for prioritizing the order in which the plurality of counters are to be incremented, or for addressing the memory location where a prioritized counter selected to incremented is located.

U.S Pat. No. 3,353,160 titled, "Tree Priority Circuit," and issued Nov. 14, 1967 to Arwin Linquist, teaches a tree priority circuit which receives several inputs in parallel and, through the use of logic gates, prioritizes the input signal. However, the Linquist patent does not disclose a system for incrementing a plurality of counters stored in one storage device or for generating an address signal to address the location where the prioritized counter is stored.

U.S. Pat. No. 3,597,641 titled, "Integrated Circuit Chips," and issued Aug. 3, 1971 to Neville Ayres, shows an integrated circuit chip having a separate storage element linked together by logic gates. Each of the separate storage elements is a counter. Similarly, U.S. Pat. No. 3,967,095 titled, "Multi-Counter Register," and issued June 29, 1976 to William Herring et al., discloses a register having a plurality of counters that count the electrical pulses that are generated from a plurality of sources wherein one counter is associated with each source. U.S. Pat. No. 4,206,346 titled, "System for Gathering Data Representing the Number of Event Occurrences," and issued June 3, 1980 to Toshio Hirosowa et al., reveals a system where a computer has a plurality of separate counters. The system counts the number of times that a plurality of events occur. However, the '641, '095 and '346 patents do not disclose a system wherein a single storage device is used to store the plurality of counters and which generates an access signal to access the location in the storage device where a particular counter is stored, where the access signal is based upon the priority in which the counters are to be accessed.

The memory based events counter of the present invention may be used in conjunction with a data transmission network, such as the Fiber Distributed Data Interface (FDDI), to monitor a plurality of systems events.

The Fiber Distributed Data Interface (FDDI) protocol is an American National Standard (ANS) for data transmission which applies to a 00 megabit/second token ring network that utilizes an optical fiber transmission medium The FDDI protocol is described in "FDDI-an Overview," *Digests of Papers IEEE Computer Society Int'l Conf., Compcon '87*, January, 1987, which is herein incorporated by reference.

The FDDI protocol is intended as a high performance interconnection among computers as well as among computers and their associated mass storage sub-systems and other peripheral equipment Information is transmitted on an FDDI ring in "frames" that consist of a sequence of 5-bit data characters or "symbols " Information is typically transmitted in symbol pairs or "bytes." Tokens are used to signify the right to transmit data between stations.

A Physical function (PHY) provides the hardware connection to adjacent stations in an FDDI network; it provides the optical fiber hardware components that allow a link from one FDDI station to another. The Physical function simultaneously receives and transmits serial data. The Physical function's receiver receives the encoded serial data stream from a station or medium, establishes symbol boundaries based on the recognition of a start delimiter symbol pair, and transmits decoded symbols to its associated media access control function (MAC).

SUMMARY OF THE INVENTION

The present invention is directed to a system which counts the number of occurrences of each of a plurality of events. Each of the events has a priority associated with it and each of the events has a count value associated with it.

The system includes a memory device which stores the plurality of count values in a preselected location. A plurality of data signals are simultaneously received by the system and temporarily stored in a storage device. Each of the signals indicates whether one of the events has occurred and is to be counted. The stored signals are periodically updated by a refresh signal and by the receipt of additional data signals.

A prioritizing device prioritizes the order in which the count values associated with the stored data signals are to be incremented by an incrementor. In addition, the system includes means responsive to the prioritized order for generating an access signal for retrieving a preselected one of the count values from the memory device. In particular, the preselected count value accessed corresponds to the event having the highest priority. Hence, the access signal generated addresses the memory location where the count value corresponding to the event to be counted, which has the highest priority, is stored.

The count value retrieved from the memory device is received by the incrementor which increments the count value. The system generates a refresh signal, to update the stored data signals, indicating that the event associated with the retrieved count value has been prioritized by the system. The access signal includes a plurality of single bit signals Each of the single bit signals is associated with a particular address location in the memory device such that a one-logic state of the single bit signals addresses the location in the memory device where the count value to be retrieved is stored. Hence, the access signal serves as a pointer to point to the location in the memory device where the count value to be retrieved is stored Thus, the present invention provides an efficient, compact incrementation and prioritization system for counting a plurality of system events. A single memory device stores a plurality of count values to minimize the area occupied by the counters on an integrated circuit The system prioritizes the order in which the count values are to be accessed for incrementation.

The present invention also provides a system which simultaneously receives a plurality of data signals indicative of the system events to be counted, and based upon the priority associated with each event to be counted, generates an address signal to directly address the location in memory where the counter prioritized for incrementation is stored, thereby eliminating the need for an address decode element Furthermore, the present invention provides a system wherein the address signal generated to access the location in memory where the count value to be incremented is stored is also the update signal used to update the data signals to reflect that the event corresponding to the access counter has been incremented.

These, and further objects and advantages of the present invention will be made clear or will become apparent during the course of the following description of the preferred embodiment of the present invention.

BRIEF DESCRIPTION OF THE DRAWINGS

In the accompanying drawings
FIG. 3A-3H are block diagrams of storage registers comprising register illustrated in FIG. 2.

DETAILED DESCRIPTION OF THE PREFERRED EMBODIMENT

Figure 1:
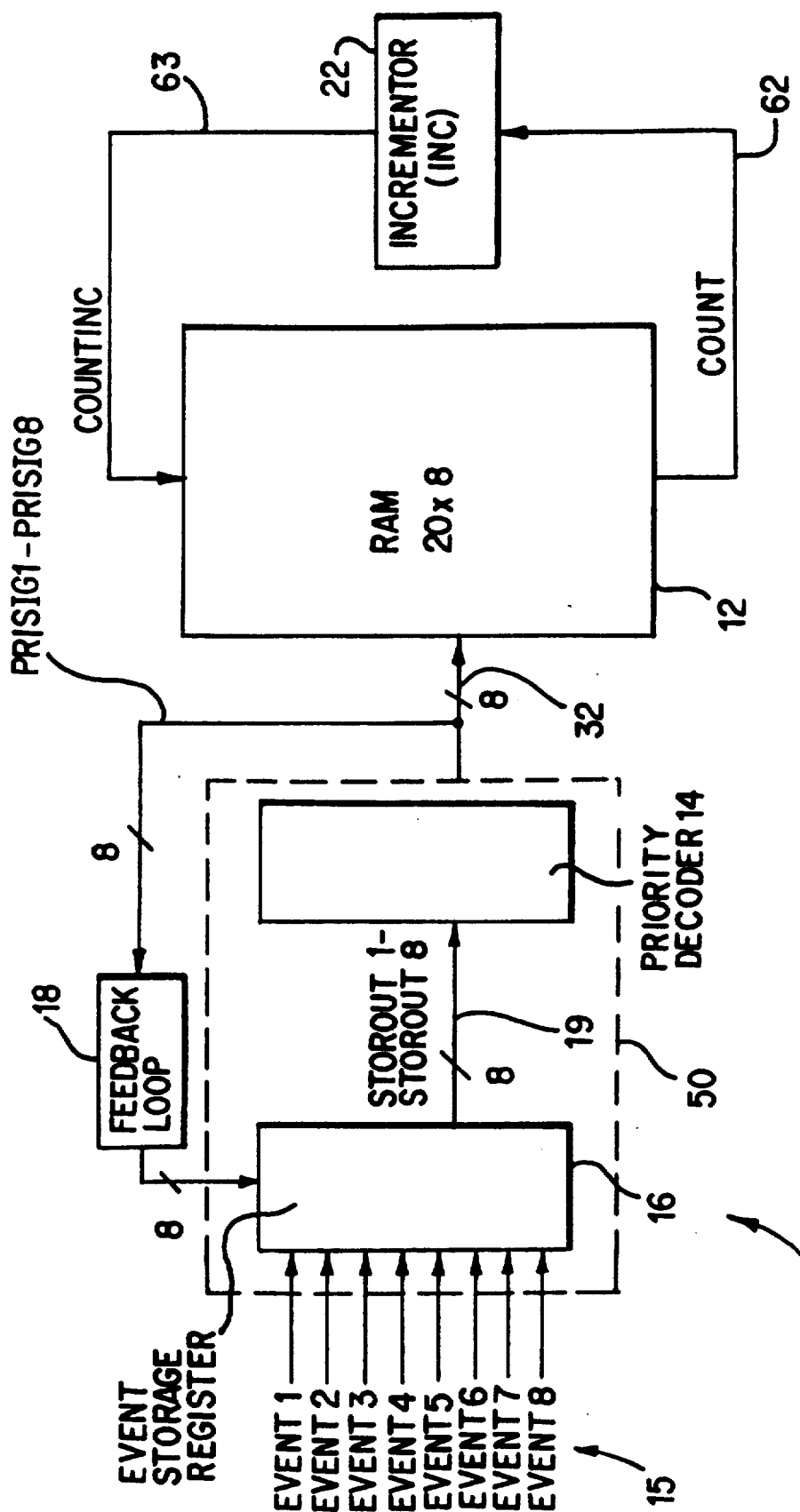
FIG. 1 is a block diagram of a memory based events counter system of the present invention.
Figure 2:
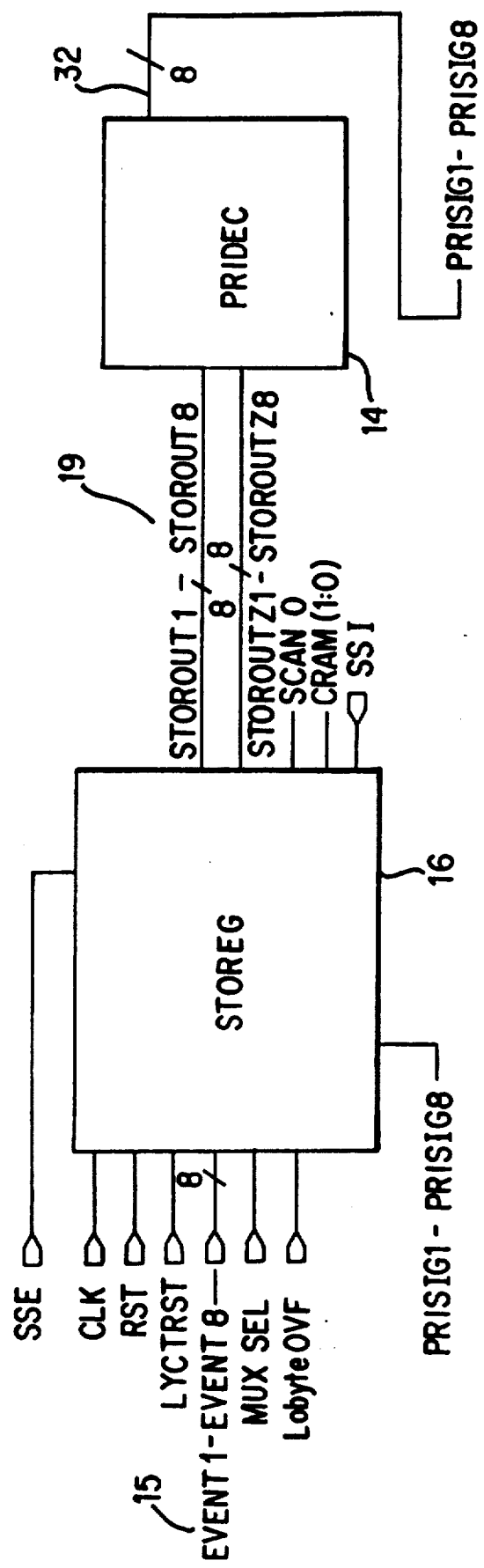
FIG. 2 is a block diagram of an N-bit storage register and a priority decoder of the present invention.
Figure 3B:
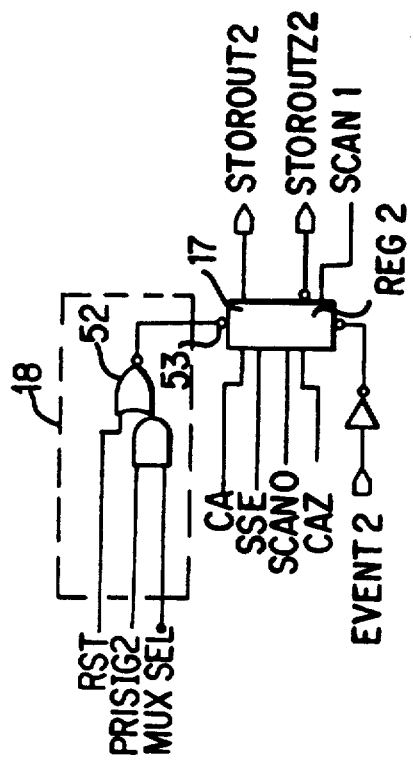
Figure 3D:
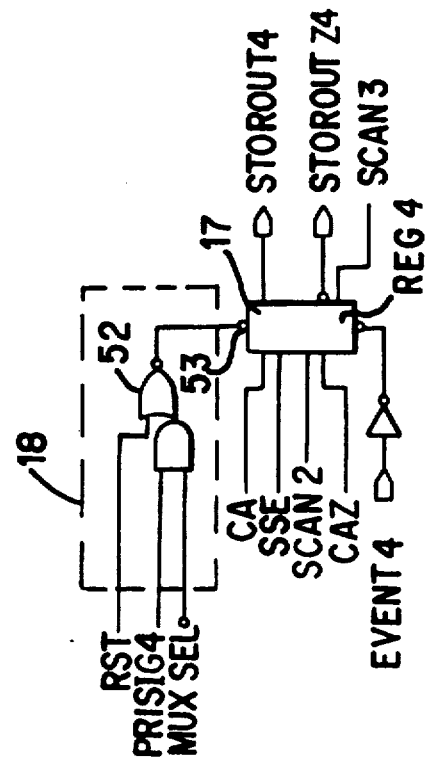
Figure 3A:
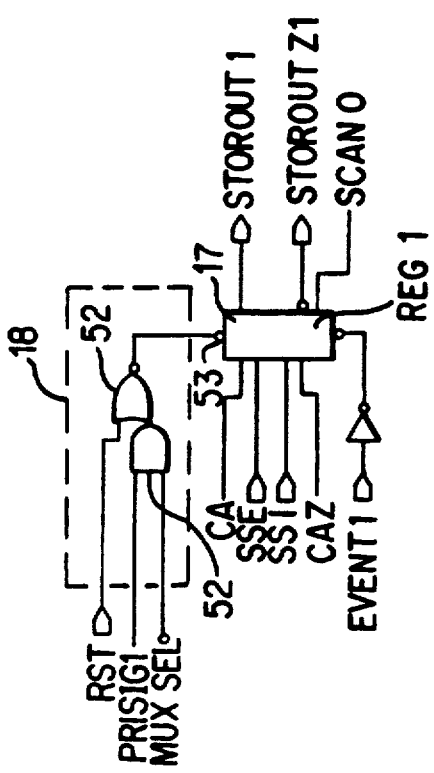
Figure 3C:
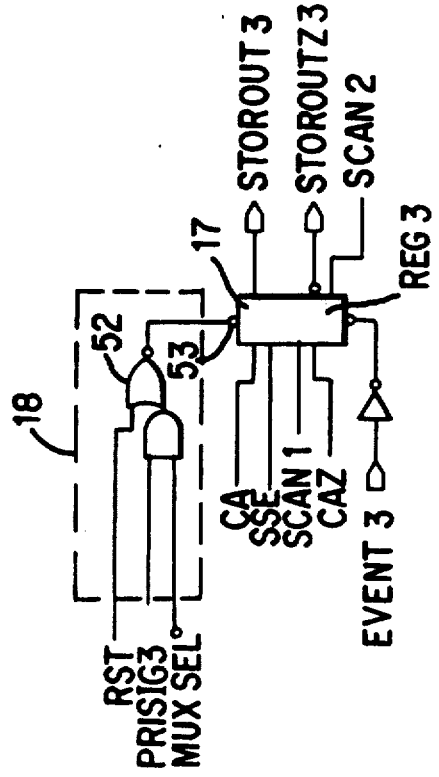

Referring to FIG. 1, an overall block diagram of a memory-based event counter system 10, for counting N events and incrementing N count values stored in a memory device 12 is illustrated. One count value is associated with each system event to be monitored within a particular clock cycle and one count value is incremented within a particular clock cycle. The memory based .event counter 10 receives an N-bit parallel data signal 15 wherein each bit EVENT1-EVENTN of the data signal 15 conveys information regarding whether a particular system event has occurred. In the preferred embodiment N=8. Each bit position EVENT1-EVENT8 is allocated to a particular system event.

In an FDDI system, eight system events are monitored and, therefore, the data signal 15 is 8 are—frame received, error isolated, lost frame, frames copied with $A_x$ set, frames not copied with $A_x$ set, frames transmitted, token received, and ring latency. Each bit EVENT1-EVENT8 of the N-bit data signal 15 is allocated to one of these system events. In the preferred embodiment, the first bit position EVENT1 corresponds to the frame received event, the second bit position EVENT2 corresponds to error isolated, the third bit position EVENT3 corresponds to lost frame, the fourth bit position EVENT4 corresponds to frames copied, the fifth bit position EVENT5 corresponds to frames not copied with $A_x$ set, the sixth bit position EVENT6 corresponds to frames transmitted, the seventh bit position EVENT7 corresponds to token received, and the eight bit position EVENT8 corresponds to latency.

If a system event has occurred, its corresponding bit position in the data signal 15 is set (i.e., a logic high or "1"); otherwise the bit is not set (i.e., a logic low or "0"). For example, if during a particular clock cycle a received frame is lost and a frame is transmitted, the 8-bit data signal 15 is 00100100 since the sixth bit position corresponds to frame transmitted and the third bit position corresponds to lost frame.

Referring also to FIGS. 2 and 3A-3H, the dat signal 15 (EVENT1-EVENT8) is provided to an N-bit event storage register (STOREG) 16 which stores the receive data signal 15. In the preferred embodiment, the event storage register 16 ani a priority decoder 14 are included on a single event register chip 50.

The event storage register 16 includes at least N single bit registers 17 (REG1-REG8). Each single bit register 17 receives a particular one of the bits EVENT1-EVENT8. For example, as illustrated, the first bit position EVENT1 of the data signal 15 is allocated to register REG1, the second bit position EVENT2 to REG2, and the N-bit position EVENTN to register REGN.

On the rising edge of a clock signal CLK, the incoming data bits EVENT1-EVENT8 are respectively PATENT latched into their designated registers REG1-REG8 The clock signal CLK is a global clock signal generated externally; it synchronizes all of the storage elements REG1-REG8. Within the same clock cycle, each of the registers 17 respectively outputs its contents STOROUT1-STOROUT8 to form an 8-bit storage out signal 19. The output of the registers 17 remain the same until the next rising edge of clock signal is received.

Since each of the single bit registers 17 clocks out a data bit identical to the data bit it stores, if an event has occurred, then the corresponding bit position STOROUT1-STOROUT8 in the storage out signal 19 is a logic high or a "1"; if a particular event has not occurred, then the corresponding bit position STOROUT1-STOROUT8 in the storage out signal 19 is a logic low or a "0". Hence, in the above example, STOROUT3 is 1 and STOROUT6 is 1 such that the storage out signal 19 is "00100100" if a frame is lost and a frame is transmitted. The singla bit registers 17 also output the complement of tha storage out signal 19 as STOROUTZ1-STOROUTZ8.

The storage out signal 19 and its complement signal are provided in parallel to a priority decoder (PRIDEC) 14. The priority decoder 14 prioritizes the order in which the system's count values are to be incremented in the succeeding clock cycles if several system events occur within a particular clock cycle. As previously discussed, in the preferred embodiment, one count value is incremented per clock cycle. The priority decoder 14 receives the storage out signal 19. Of the bit positions STOROUT1-STOROUT8 of the signal 19 which are a logic high, indicating that a particular system event has occurred and its associated count value is to be incremented, the priority decoder 14 grants priority to only one of the count values.

Figure 4:
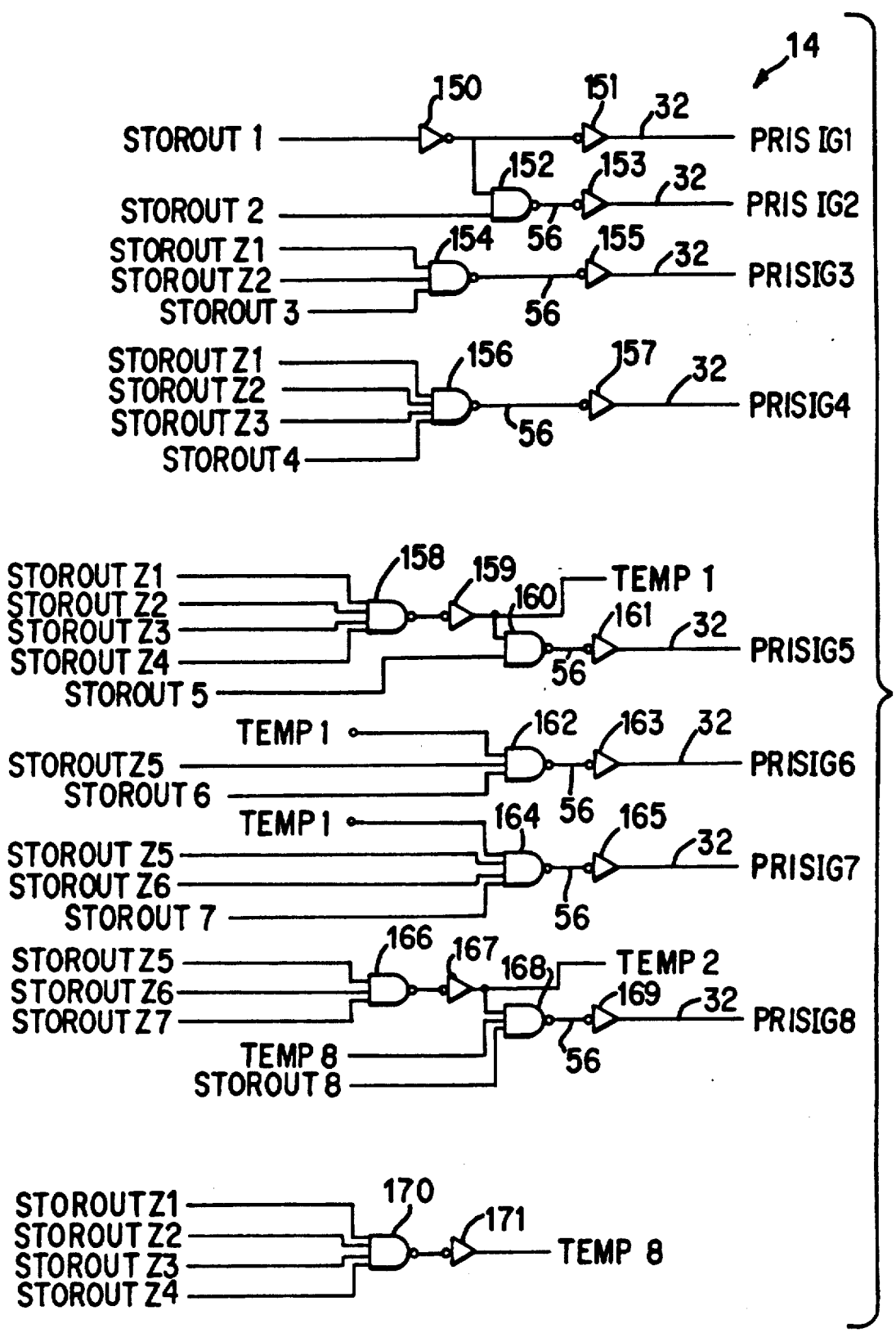
FIG. 4, is a block diagram of the priority decoder illustrated in FIG. 2.

Referring to FIG. 4, the priority decoder 14 includes a plurality of logic elements 150-173 and has N inputs and N outputs (excluding the complement of the input and outputs), where the N-bit inputs correspond to the bits comprising the storage out signal 19. The logic elements 150-171 comprising the priority decoder 14 and the N bits of the storage out signal 19 are preselectively arranged based upon the order of priority associated with each system event and, hence, the priority to be assigned to each of the single bits STOROUT1-STOROUT8 comprising the storage out signal 19. Events are prioritized such that those which can occur most frequently will be serviced first. The priority decoder 14 assigns priority to the single bits STOROUT1-STOROUT8 of the storage out signal 19 which are a logic high.

In the preferred embodiment, the storage out signal 19 (STOROUT1-STOREOUT8) and its complement (STOROUTZ1-STOROUTZ8) are provided to NAND gates 152, 154, 156, 158, 160, 162, 164, 166, 168. In the illustrated embodiment, for an 8-bit priority decoder 14 having eight inputs and eight outputs, the logic elements are arranged such that priority is assigned to the bits STOROUT1-STOROUT8 as follows:

PRISIG1 = STOROUT1

PRISIG2 = STOROUT2 and not STOROUT1

PRISIG3 = STOROUT3 and not STOROUT1 and not STOROUT2

PRISIG4 = STOROUT4 and not STOROUT1 and not STOROUT2 and not STOROUT3

PRISIG5 = STOROUT5 and not STOROUT1 and not STOROUT2 and not STOROUT3 and not STOROUT4

PRISIG6 = STOROUT6 and not STOROUT1 and not STOROUT2 and not STOROUT3 and not STOROUT4 and not STOROUT5

PRISIG7 = STOROUT7 and not STOROUT1 and not STOROUT2 and not STOROUT3 and not STOROUT4 and not STOROUT5 and not STOROUT6

PRISIG8 = STOROUT8 and not STOROUT1 and not STOROUT2 and not STOROUT3 and not STOROUT4 and not STOROUT5 and not STOROUT6 and not STOROUT7

For example, in the preferred embodiment, to implement the aforementioned priority assignments, to assign priority to the eighth event (which corresponds to the eighth bit position STOROUT8 of the storage signal 19), the complement of the other bits comprising the storage out signal 19 are AND-ed together with the bit associated with the eighth event STOROUT8 Hence, PRISIG8 = STOROUT8 and STOROUTZ7 and STOROUTZ6 and STOROUTZ5 and STOROUTZ4 and STOROUTZ3 and STOROUTZ2 and STOROUTZ1 and logic elements 170, 171, 166, 168 and 169 are used to implement the equation.

NAND gate 170 is a four input NAND gate which has the complement of some of the bits comprising the storage out signal 19 as its input: in particular STOROUTZ1, STOROUTZ2, STOROUTZ3, and STOROUTZ4. The output of the NAND gate 170 is inverted by logic gate 71 to produce a first temporary signal, TEMPB. Thus, TEMPB = STOROUTZ1 and STOROUTZ2 and STOROUTZ3 and STOROUTZ4.

Similarly, NAND gate 166 and inverter 167 generate a second temporary signal TEMP2 which is the product of ANDing together the complement of the STOROUT5-STOROUT7 bits: TEMP2 = STOROUTZ5 and STOROUTZ6 and STOROUTZ7. NAND gate 168 has 3 inputs: TEMP2, TEMPB and STOROUT8 The output of NAND gate 68 is inverted by inverter 169 to produce a priority signal PRISIG8 which is indicative of the priority to be assigned to the eighth event.

Those skilled in the art will recognize that other logic configurations may be employed in the priority decoder 14 and that the logic gates 150-170 and the N-bits comprising the storage out signals 19 STOROUT1-STOROUT8 may be input to the decoder 14 in a different manner. Each one of the N bits PRISIG1-PRISIG8 generated by the priority decoder 14 is associated with one of the N monitored system events. The N bits generated PRISIG1-PRISIG8 comprise the priority signal 32. Hence, the priority decoder 14 generates an N-bit parallel priority signal 32 where in the preferred embodiment there is a one to one correspondence between the event associated with the bits of the storage out signal 19 and the event associated with the bits of the priority signal 32.

Of the N priority bits PRISIG1-PRISIG8 comprising the priority signal 32, only one of them is granted priority (i.e. is a logic high); the remaining N-1 priority bits are not granted priority (i.e. are a logic low). As such, the logic elements 150-171 are arranged so that only one of priority bits generated PRISIG1-PRISIG8 is a logic high (i.e., granted priority) while the remaining bits are a logic low (i.e., not prioritized).

Figure 6:
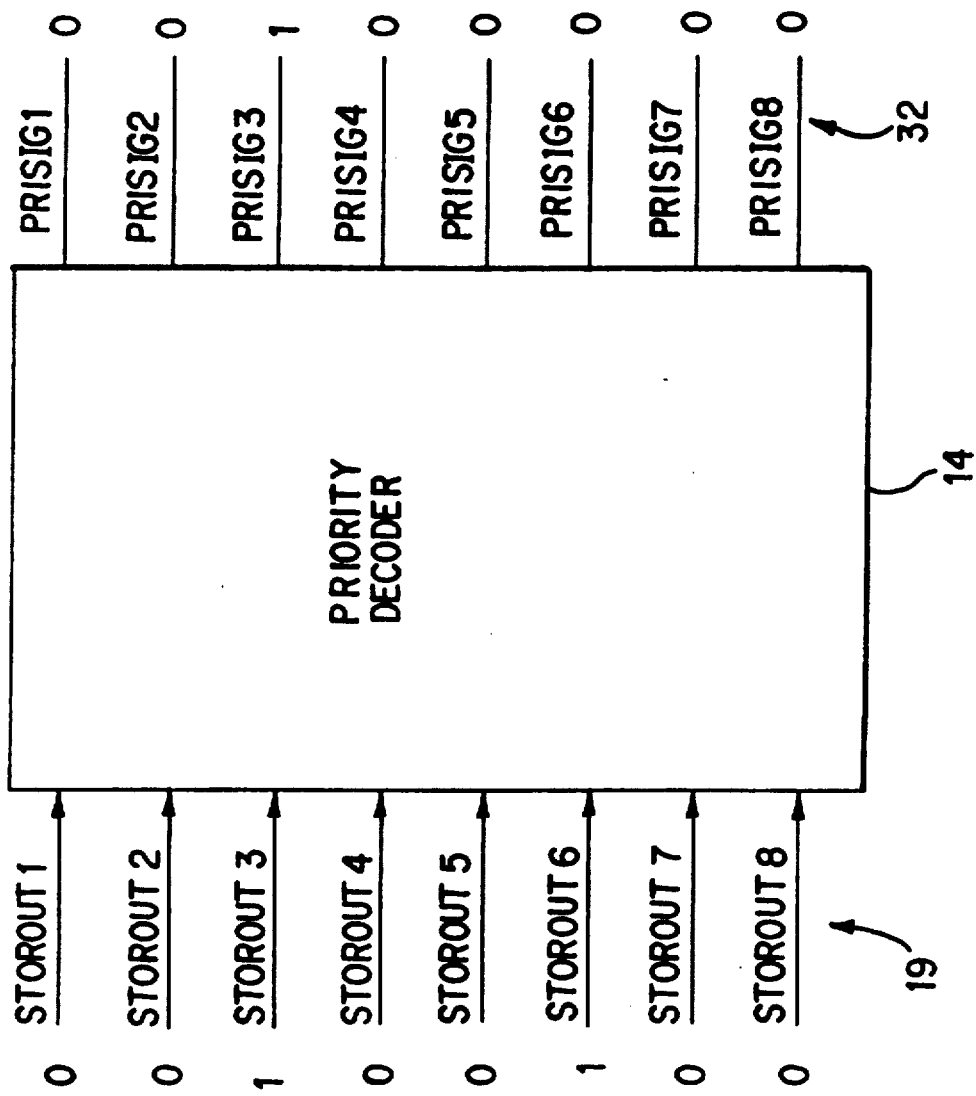
FIG. 6.is a block diagram of the input signal and output signals of a priority decoder of the present invention.

Referring to FIG. 6, for example, if the storage out signal 19 is "00100100", of the bits that are a logic high, then the storage out bit with the highest priority is the STOROUT8 bit, and the priority decoder 14 outputs the priority signal 32 "00100000". Thus, priority is granted to the PRISIG3 bit position which is designated to correspond to the system event which corresponds to the STOROUT3 bit position.

Referring again to FIGS. 1-3, the priority signal 32 (PRISIG1-PRISIG8) is provided in parallel back to the event storage register 16 (and in particular, to the single bit storage registers 17) and is referred to in FIG. 1 as a "feedback loop" 18. The purpose of the feedback loop 18 is to clear the contents of the single bit register 17 corresponding to the system event that was granted priority by the priority decoder 14 before the next clock cycle begins. The contents of the storage register 17 corresponding to the prioritized event is cleared to ensure that the same event is not incorrectly prioritized and incremented again during the next clock cycle.

Referring in particular to FIG. 3, the feedback loop 18 also includes logic circuitry 52 coupled to the priority signals PRISIG1-PRISIG8. The single bit signal generated by the feedback loop 18 is input to a reset node 53 on the single bit register 17. If the signal into the reset node 53 is high, then the contents of that particular storage register 17 are cleared. Thus, in the example presented above, where the priority signal 32 is "00100000", the third register REG3 is cleared since the PRISIG3 bit position corresponds to and is input to REG3. A reset signal RST input to the feedback loop logic circuitry 52 is a global reset function of the entire system of which the event counter 10 is a part. If RST is 1, then the entire chip will be sent to a known state called Reset, where all prior events are discarded.

Figure 5:
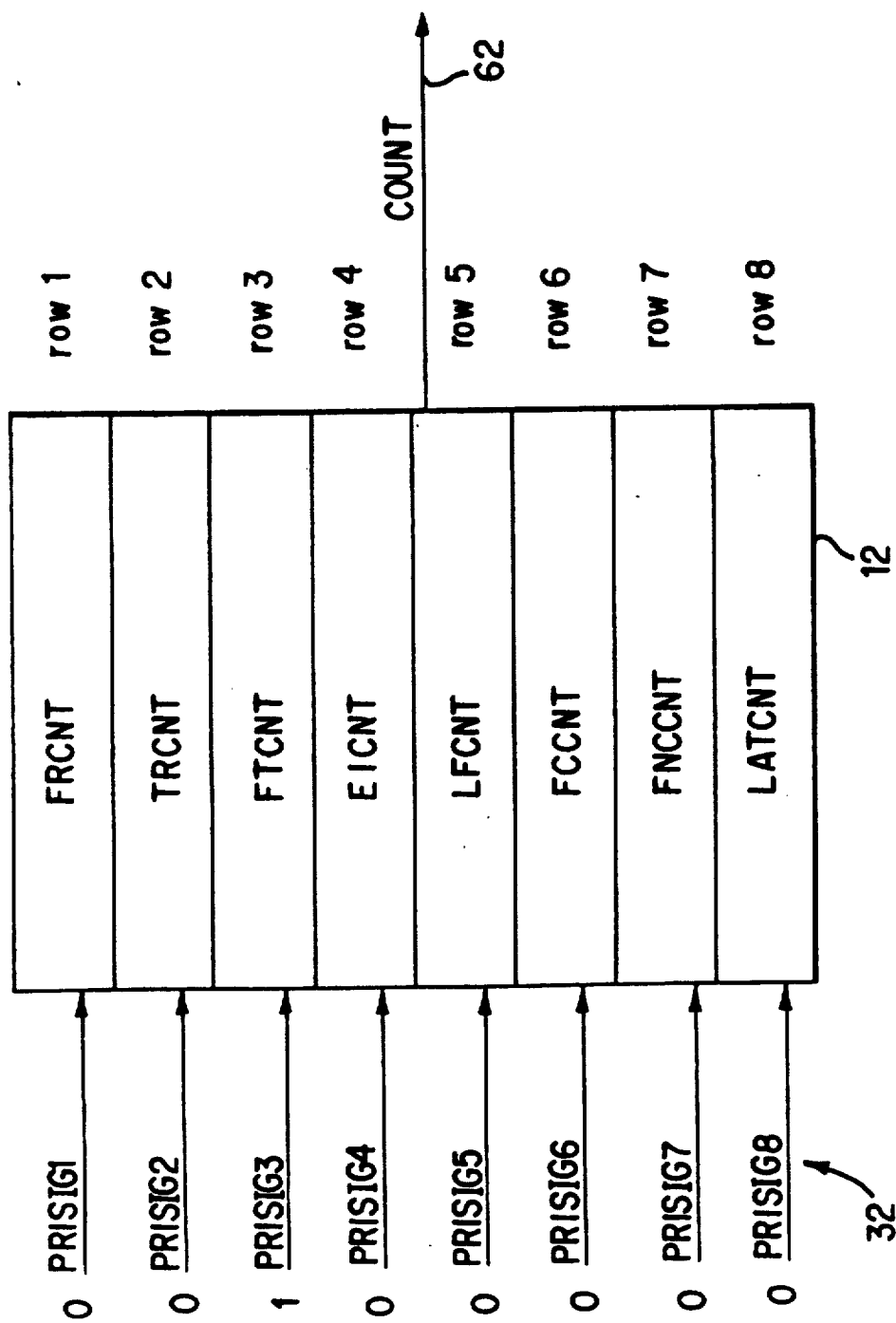
FIG. 5 is a block diagram of a memory of the present invention.

Referring to FIGS. 1 and 5, the priority signal 32 (PRISIG1-PRISIG8) is also input in parallel to a memory 12, which in the preferred embodiment is a random access memory (RAM). Tne memory 12 is an X by Y memory where Y is the number of rows, which is greater than or equal to N, and X is the number of bits per row. As illustrated, the memory 12 is a 20 X 8 memory, where each row (row 1-8) in the memory 12 is designated to store a particular count value, where there is one count value for each of the monitored system events. Thus, each row in the memory 12 is referred to as a particular "event counter." For example, the row 1 is designated as the frame received counter and stores the frame received count value (FRCNT); row 2 is designated as the error isolated counter and stores the error isolated count value (EICNT); row 3 is the lost frame counter and stores the lost frame count value (LFCNT); row 4 is the frames copied counter and is designated to store the frames copied count value (FCCNT); row 5 is the frames not copied with $A_x$ set counter and stores the frames not copied count value (FNCCNT); row 6 is designated as the frame transmitted counter and stores the frame transmitted count value (FTCNT); row 7 is designated as the token received counter and stores the token received count value (TRCNT); and row 8 is the latency counter and stores the latency count value (LATCNT). Since there are eight monitored events, there are eight event counters and at least eight rows in the memory 12.

Since the 8-bit parallel priority signal 32 PRISIG1-PRISIG8 is input to the memory 12 in parallel, each of the one-bit priority signals PRISIG1-PRISIG8 directly addresses the row in memory 12 corresponding to where its associated count value is stored. Hence, each of the bits PRISIG1-PRISIG8 comprising the priority signal 32 serves as a memory row select.

A particular row (row 1-8) is accessed when it is addressed if its input PRISIG1-PRISIG8 is high. As previously discussed, since only one count value is incremented per clock cycle, only one of the bits comprising the priority signal 19 is high, and therefore only the row in memory 12 which is addressed by the high bit is accessed. Since there are no memory addresses to decode, the system 10 does not need address decode circuitry.

For the memory row that is addressed and accessed, the count value stored in the addressed row is read out of the memory 12 as a current count data signal 62 (COUNT). For example, in the priority signal 32 "00100000", the third bit position PRISIG3 is high. Since in the preferred embodiment, the PRISIG3 bit position is designated to address the third row (row 3) in memory 12, the lost frame count value LFCNT is output from the memory 12 in parallel as the current count value signal 62. In the preferred embodiment, the count value signal is 20 bits wide.

In the preferred embodiment, during one clock cycle, the data signal 15 is read into the event storage register 16, prioritized by the priority decoder 14, and the RAM 12 is addressed. During the same clock cycle, the count value stored in the addressed row is read out of the RAM 12 and is input to an incrementor 22 (INC). The incrementor 22 increments the current count data signal 62 by one, and during the same clock cycle, writes the updated count data signal 63 (COUNTINC) back into the same row (i.e. location) in memory 12 where the current count data signal 62 COUNT had been stored. The incrementor 22 employed may, on over flow of the count value, write the unincremented count value back to the RAM 12. If multiple events occur in a single clock cycle the event(s) having a lower priority is (are) saved in the event storage register 16 and their corresponding contents are incremented on subsequent clock cycles.

Figure 7:
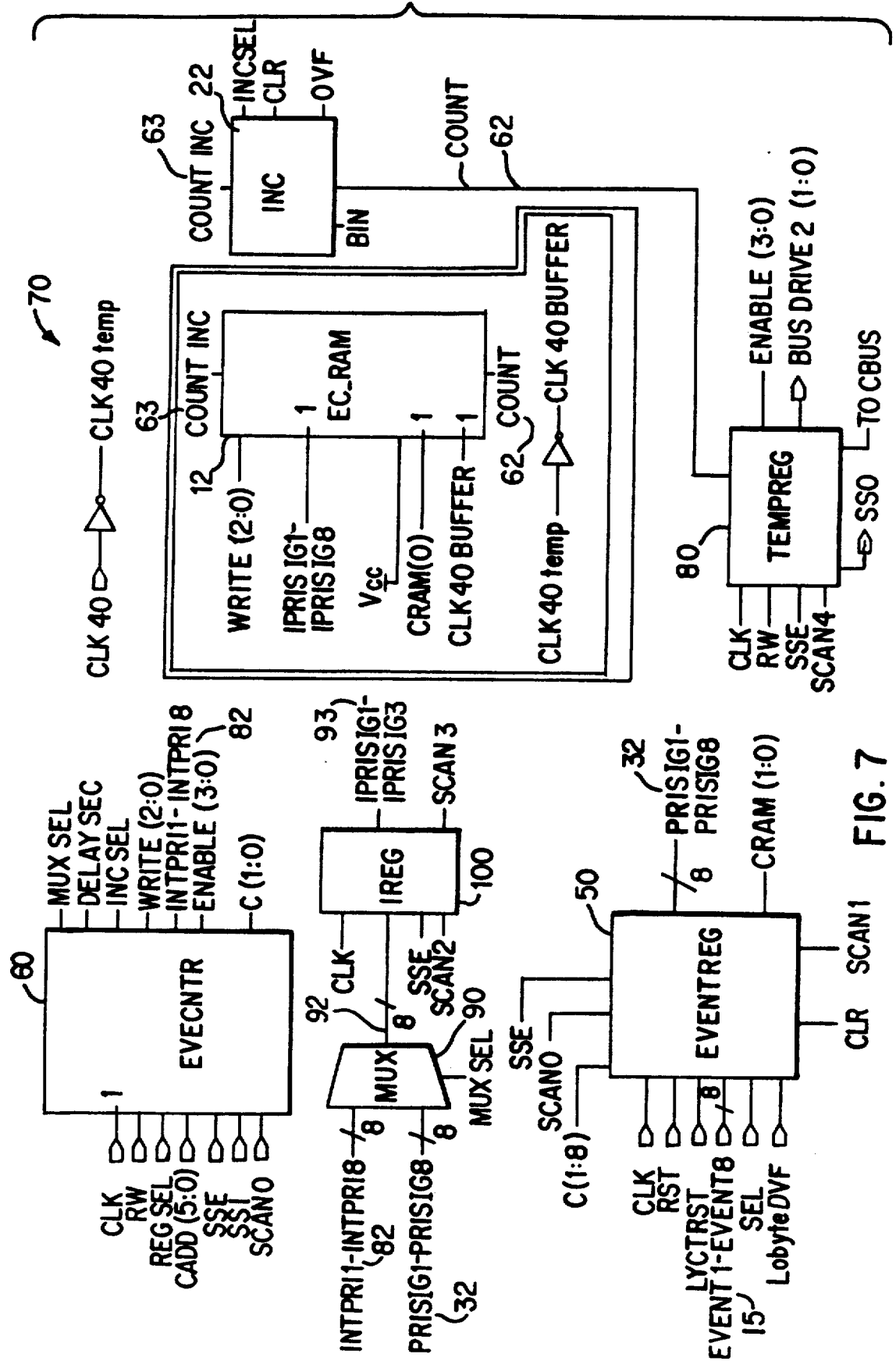
FIG. 7 is a block diagram of an alternate embodiment of the present invention.

FIG. 7 shows an alternate embodiment of a memory based event counter 70 in accordance with the present invention. Similar elements in the alternate counter 70 are referred to with the same reference numeral/names as used to describe the counter 10 shown in FIG. 1. The alternate system 70 further includes an event controller (EVECNTR) 60, a multiplexer (MUX) 90, an interrupt storage register (IREG) 100 and a temporary storage register 80 (TEMPREG) to enable the count values stored in the RAM 12 to be read and written via a control access bus. The control access bus is an external port which enables an external user to read from or write to the system 70.

The event controller 60 is controlled externally. The event controller 60 detects an access request by the external user and disables the event register 50 from accessing the RAM 12 if an interrupt access request signal is received. In particular, the event controller 60 receives an interrupt address signal CADD from the access bus. The interrupt address signal CADD indicates the memory location in the RAM 12 to be accessed. The event controller 60 also receives a read select signal REDSEL which indicates whether the data in the RAM 12 is to be read to or written from; and a read/write signal RW which indicates the specific operation to be performed (i.e., the read operation or the write operation), if any. In the preferred embodiment, even if the event register 50 is not to be interrupted by the event controller 60, (i.e., no REDSEL signal is received) the event controller 60 receives an interrupt address signal CADD and generates an interrupt priority signal (INTPRI1-INTPRI8), 82 which is a function of the interrupt address signal CADD. The interrupt priority signal 82 is similar to the priority signal 32 in that it is an N-bit signal which addresses the row in memory 12 to be addressed. The event controller 60 also generates a MUX select signal MUX SEL; a write signal WRITE; and an incrementor selected signal INCSEL; and an enable signal ENABLE.

The interrupt priority signal 82 and the priority signal 32 generated by the event register 50 are input in parallel to the MUX 90. The MUX 90 also receives the MUX select signal MUX SEL from the event controller 60. If the event register 50 is to be interrupted, the MUX SEL signal instructs the MUX 90 to pass the interrupt priority signal 82 as the MUX output signal 92. The MUX output signal 92 is input to the interrupt storage register 100. If the incrementation process is not to be interrupted, the MUX SEL signal instructs the MUX 90 to pass the priority signal 32 as its output signal 92.

In the preferred embodiment, if the MUXSEL signal is a logic high, then the priority signal is selected; if the MUXSEL signal is a logic low, then the interrupt priority signal 82 is selected. When the interrupt priority signal 82 is selected, then the feedback loop 18 is not completed. The priority signal 32 is not provided back to the event storage register 16 so that the content of the register corresponding to the prioritized event is not cleared since the external interrupt priority signal 82 was selected. Otherwise, the prioritized event would be lost since the priority signal 32 was not selected.

The interrupt storage register 100 temporarily stores the MUX output signal 92 it receives (i.e., the priority signal 32 or the interrupt priority signal 82) and reads it out in parallel as the stored priority signal 93 (IPRISIG1-IPRISIG8). The stored priority signal 92 is input to the RAM 12 and serves as a pointer to select one of the memory rows 12 to be accessed. The count value COUNT 62 stored in the accessed row is read out and input to the incrementor 22 and the temporary register 80. In the preferred embodiment, the temporary storage register (TEMPREG) 80, is a 20 bit register. The count value 62 stored in the addressed row in the RAM 12 (for example, row 2, the ET COUNT value) is read out as the COUNT 62 signal and input to the temporary storage register 80 and the incrementor 22.

The temporary register 80 also receives the enable signal ENABLE generated by the event controller 60. When the temporary register 80 is enabled by the ENABLE signal, the count value 62 is read out to an external bus CBUS.

The count value 62 received by the incrementor 22 is incremented. However, the incrementor 22 may also receive an external data signal BIN. The external data signal BIN may be stored in the RAM 12 in the location where the count value 62 was previously stored. The incrementor 22 has an internal multiplexer which is controlled by the incrementor select signal INCSEL to select whether the incremented count value or the external data signal BIN is to be output as the COUNTINC signal 63. The RAM 12 receives the write enable signal WRITE generated by the event controller 60. When the WRITE signal is enabled, the COUNTINC signal 63 is written into the accessed memory location (for example, row 2).

In the preferred embodiment of the system 10, 70, there is about 80 nsec between clock cycles and therefore about 80 nsec available to read in the data signal 15, store it in the event storage register 16, prioritize it by the priority decoder 14, access the RAM 12, increment the count value, and write the incremented count value back in the RAM 12 before the next clock cycle begins.

In the preferred embodiment of the system 70, during a first clock cycle, the data signal 15 is loaded into the single bit event registers 17, prioritized by the priority decoder 14, the MUX 90 selects its output, and the interrupt register 100 stores the MUX output signal 92 it receives. During the next clock cycle, the stored priority signal 93 (IPRISIG1-IPRISIG8) is read out of the interrupt register 100 in parallel, input to the RAM 12 to select a particular row. The count value COUNT 62 stored in the accessed ro is read out and input to both the incrementor 22 and the temporary storage register 80. The incrementor 22 increments the count value 62 by one and the incrementor output signal 63 is input to the RAM 12. By prioritizing and incrementing the current count value over two clock cycles, the alternate system 70 ensures that there is enough time per clock cycle to perform the tasks of prioritizing and incrementing.

Having thus described the invention, it is recognized that those skilled in the art ma make various modifications or additions to the preferred embodiment chosen to illustrate the invention without departing from the spirit and scope of the present contribution to the art. Accordingly, it is to be understood that the prosecution sought and to be afforded hereby should be deemed to extend to the subject matter claimed and all equivalents thereof within the scope of the invention.

What is claimed is:

1. A prioritized memory-based event counter for counting the number of occurrences of each of a plurality of events in accordance with a preselected priority assigned to each of the events, the event counter responsive to a parallel, multi-bit data input signal comprising a plurality of data bits, each data bit being associated with a corresponding one of the vents such that said data bit having a first logic state indicates the occurrence of said correspondign event and said data bit having a second logic state indicates the non-occurrence of said corresponding event, the event counter comprising:

(a) a memory element that includes a plurality of count value storage locations, each storage location storing a corresponding count value indicating the number of occurrences of one of the events, each storage location having a corresponding access address associated thereiwth such that the memory element responds to receipt of said access address by providing the count value stored in aid storage location as a memory element output signal;

(b) a storage register that stores the plurlaity of data bits and responds to a clock signal by providing a parallel storage register output signal that includes the plurality of data bits;

(c) a priority decoder that decodes the storage register output signal based on the logic state of each of the plurality of data bits to provide a priority decoder output signal that includes the access address of the memory element storage location that stores the count value of the event corresponding to a priority data bit included in the plurality of data bits and having the first logic state and having the highest assigned priority of all data bits having the first logic state, the memory element being responsive to said access address for providing said count value as the memory element output signal; and (d) incrementing means responsive to said count value for incrementing said count value and storing said incremented count value to said accessed memory element storage location.

2. A prioritized memory-based event counter as in claim 1 and further comprising feedback means connected between the priority decoder and storage register responsive to said priority decoder output signal for generating a feedback signal that resets said priority data bit to the second logic state in the storage register.

3. A prioritized memory-based event counter as in claim 1 and further comprisign multiplexor means connected between the priority decoder and the memory element for selecting one of a plurality of access address input signals, said access address input signals including the priority decoder output signal, as the access address to the memory element.

4. A prioritized memory-based event counter as in claim 3 and further comprisign access address storage means connected between the multiplexor and the memory element for storing the access address selected by the multiplexor.

5. A prioritized memory-based event counter as in claim 4 and further comprising count value storage means connected to receive the count value stored in the memory element storage location accessed by the access address selected by the multiplexor.

6. A method of prioritized counting of the number of occurrences of each of a plurality of events in accordance with a preselected priority assigned to each of the vents and in response to a parallel, multi-bit data input signal comprising a plurality of data bits, each data bit being associated with a corresponding oen of the events such that said data bit having a first logic state indicates the occurrence of said corresponding event and said data bit having a second logic state indicates the non-occurrence of said corresponding event, the method comprsiing:

for each event, storing a count value in a memory element that includes a plurality of count value storage locations, each storage location storing a corresponding count value indicating the number of occurrences of the corresponding event, each storage location having a corresponding access address associated therewith such that the memory element responds to receipt of said access address by providing the count value stored in said storage location as a memory element output signal;

storing the plurality of data bits in a storage register that responds to a clock signal by providing a parallel storage register output signal that include the plurality of data bits;

decoding the storage register output signal based on the logic state of each of the plurality of data bits to provide a priority decoder output signal that includes the access address of the memory element storage location that stores the count value of the event corresponding to a priority data bit included in the plurality of data bits and having the first logic state and having the highest assigned priority of all data bits having the first logic state, the memory element being responsive to said access address for providing said count value as the memory element output signal;

incrementing said count value; and storing said incremented count value to said accessed storage location.

7. A method as in claim 6 and comprising the further step of generating a feedback signal that resets said priority bit t the second logic state in the storage register.

8. A method as in claim 6 wherein the priority decoder output signal is provided to a multiplexor as one of a plurality of input signals and wherein a multiplexor output is selected as the memory element access address.

9. A method as in claim 8 and including the further step of storing the access address selected by the multiplexor.

10. A method as in claim 9 and including the further setp of storing the count value provided as the memory element output signal.

* * * * *

UNITED STATES PATENT AND TRADEMARK OFFICE
CERTIFICATE OF CORRECTION

PATENT NO. : 5,089,957
DATED : February 18, 1992
INVENTOR(S) : Perry S. Stultz, James R. Hamstra It is certified that error appears in the above - identified patent and that said Letters Patent is hereby corrected as shown below:

In col. 4, line 63 the word dat should be --data--.
In col. 4, line 67 the word ani should be --and--.
In col. 5, line 11 insert after REG1-REG8 --.--.
In col. 5 line 29 the word singla should be --single--.
In col. 5 line 30, the word tha should be --the--.
In col. 6 line 28, after STOROUT8 insert --.--.
In col. 7 line 21, the word feedbaok should be --feedback--.
In col. 7 line 47, the word Tne should be --The--.
In col. 10 line 25, the word ro should be --row--.
In col. 10 line 35, the word ma should be --may--.
In col. 10 line 52, the word correspondign should be --corresponding--.
In col. 10 line 61, the word thereiwth should be --therewith--.
In col. 10 line 63, the word aid should be --said--.
In col. 10 line 66, the word plurlaity should be --plurality--.
In col. 11 line 26, the word comprisign should be --comprising--.
In col. 11 line 33, the word comprisign should be --comprising--.
In col. 11 line 45, the word vents should be --events--.
In col. 11 line 47, the word oen should be --one--.
In col. 12 line 3, the word comprsiing should be --comprising--.
In col 12 line 47, the word setp should be --step--.

Signed and Sealed this

First Day of June, 1993

*Attest:*

MICHAEL K. KIRK

*Attesting Officer*  Acting Commissioner of Patents and Trademarks